(12) United States Patent
Pang et al.

(10) Patent No.: US 6,282,127 B1
(45) Date of Patent: Aug. 28, 2001

(54) BLOCK RAM WITH RESET TO USER SELECTED VALUE

(75) Inventors: Raymond C. Pang; Steven P. Young; Trevor J. Bauer, all of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/625,672

(22) Filed: Jul. 24, 2000

Related U.S. Application Data

(63) Continuation-in-part of application No. 09/244,328, filed on Feb. 3, 1999, now Pat. No. 6,101,132.
(51) Int. Cl.[7] .................................................. G11C 7/00
(52) U.S. Cl. .............................. 365/189.02; 365/189.05; 365/189.08
(58) Field of Search ....................... 365/189.02, 189.08, 365/189.05, 230.02

(56) References Cited

U.S. PATENT DOCUMENTS

| | | |
|---|---|---|
| 5,421,000 | 5/1995 | Fortino et al. . |
| 5,835,406 | 11/1998 | Chevallier et al. . |
| 5,844,851 | 12/1998 | Pascusi et al. . |
| 5,923,594 | 7/1999 | Voshell . |
| 5,923,595 | 7/1999 | Kim . |

*Primary Examiner*—Son T. Dinh
(74) *Attorney, Agent, or Firm*—Scott R. Brown, Esq.; Edel M. Young

(57) ABSTRACT

A RAM block includes a circuit for causing the RAM to provide a reset value on the output or a previously captured output value from the RAM when a Reset signal is active. The Reset signal does not change the RAM contents but causes all outputs of the block RAM to be either a reset value or a capture value, as selected by the user. This is useful when the RAM block is configured as a state machine. Thus, in an FPGA or other programmable device, an application can start the state machine in a known state with all address bits equal to 0 and can reset the state machine to this startup state. When the reset signal is active, the state machine can feed back the reset value or capture value to the address inputs of the RAM block that receive state feedback data, regardless of the data actually in those locations.

6 Claims, 4 Drawing Sheets

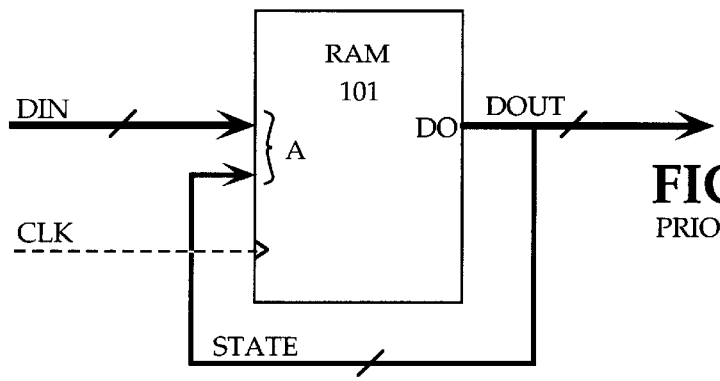
FIG. 1
PRIOR ART
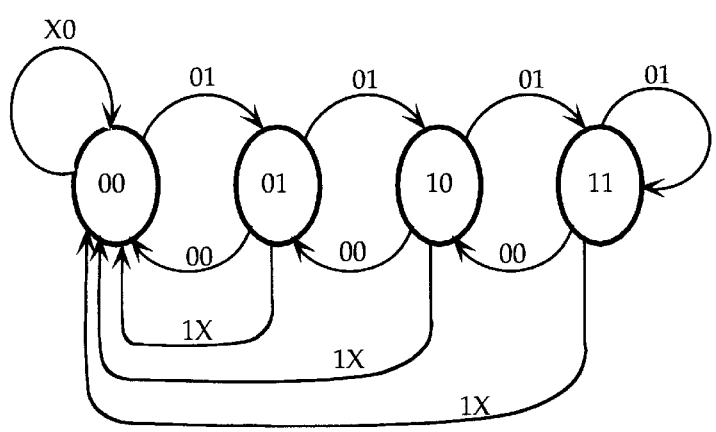
FIG. 2
PRIOR ART
| ADDRESS | | DATA |
|---|---|---|
| DIN | OLD STATE | NEW STATE |
| 00 | 00 | 00 |
| 00 | 01 | 00 |
| 00 | 10 | 01 |
| 00 | 11 | 10 |
| 01 | 00 | 01 |
| 01 | 01 | 10 |
| 01 | 10 | 11 |
| 01 | 11 | 11 |
| 10 | 00 | 00 |
| 10 | 01 | 00 |
| 10 | 10 | 00 |
| 10 | 11 | 00 |
| 11 | 00 | 00 |
| 11 | 01 | 00 |
| 11 | 10 | 00 |
| 11 | 11 | 00 |
FIG. 3
PRIOR ART

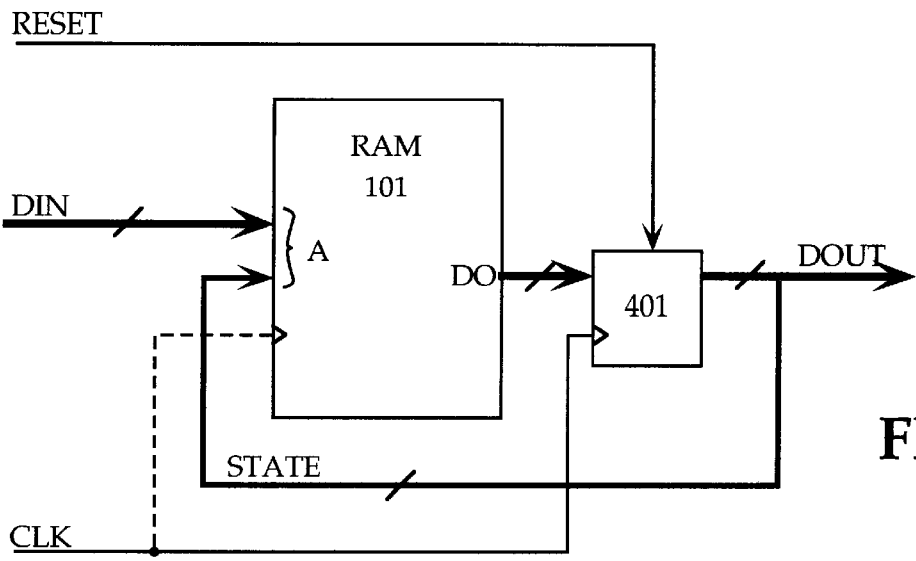
FIG. 4
| ADDRESS | | DATA |
|---|---|---|
| | OLD | NEW |
| DIN | STATE | STATE |
| 0 | 00 | 00 |
| 0 | 01 | 00 |
| 0 | 10 | 01 |
| 0 | 11 | 10 |
| 1 | 00 | 01 |
| 1 | 01 | 10 |
| 1 | 10 | 11 |
| 1 | 11 | 11 |
FIG. 5
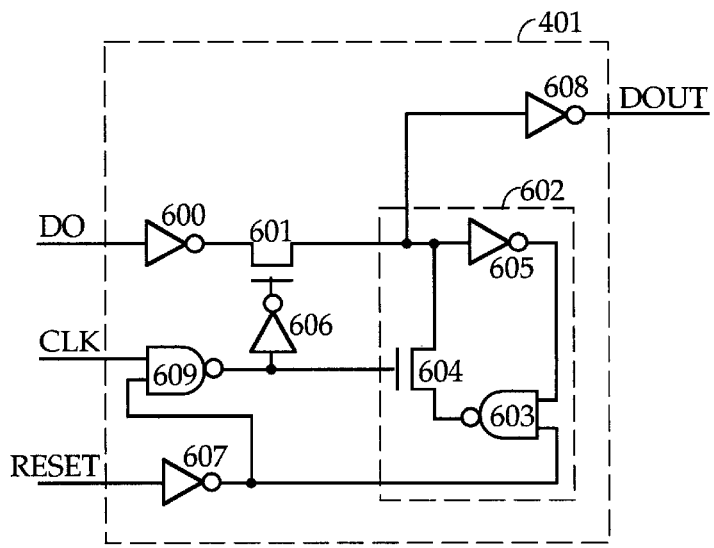
FIG. 6

BLOCK RAM WITH RESET TO USER SELECTED VALUE

CROSS-REFERENCE TO RELATED APPLICATIONS

This application is a continuation-in-part of application Ser. No. 09/244,328 now U.S. Pat. No. 6,101,132 filed Feb. 3, 1999.

FIELD OF THE INVENTION

The invention relates to integrated circuits, more particularly to field programmable logic devices having blocks of RAM.

BACKGROUND

FIG. 1 shows a RAM used as a ROM and configured as a finite state machine. Some of the finite state machine (FSM) input wires carry input signals and some carry feedback signals to tell what state the machine is in. Together, these signals form the address of a memory cell in the ROM. Data output from the addressed word of the ROM goes on data-out wires, some of which are state wires that feed back to the address input ports, and some of which form the FSM output. In a state machine some of the address bits are controlled by output data fed back from the block RAM and other address bits are provided externally.

FIG. 2 shows an example state machine that can be implemented by the ROM structure of FIG. 1. This state machine moves up one state or remains in the highest state in response to a data value of 01. It moves down one state or remains in the lowest state in response to a data value of 00. And it resets to state 00 in response to a data value of 10 or 11. In other words, the first bit serves as a reset signal. FIG. 3 shows the addresses and data values to be stored in the ROM structure of FIG. 1 for implementing this state machine. Sixteen memory locations are required in order to get the fast reset to state 00 required by the state machine of FIG. 2.

It would be preferable to use fewer memory locations to implement such a simple state machine.

SUMMARY OF THE INVENTION

According to the invention, a RAM includes a circuit for causing the RAM to provide all 0's on the output when a Reset signal is active. The Reset signal does not change the RAM contents but causes all outputs of the RAM to be 0 (or 1 in another embodiment). This is useful, for one example, when the RAM is configured as a state machine. Thus, in an FPGA or other programmable device, an application can start the state machine in a known state with all address bits equal to 0 and can reset the state machine to this startup state. When the reset signal is active, the state machine feeds back the state of 0 to the address inputs of the RAM that receive state feedback data, regardless of the data actually in those locations. The circuit of the invention is also useful in any case where the user wishes to mask the RAM output data without using additional gating circuitry that may hurt performance.

In another embodiment of the invention, the RAM includes a circuit for causing the RAM to provide a value regardless of the RAM contents when a set/reset signal is active. The reset value is programmable by the user. Additionally, the circuit has the ability to capture the value output by the RAM and restore that value when a Restore signal is active.

BRIEF DESCRIPTION OF THE DRAWINGS

FIG. 1 shows a prior art use of a RAM as a state machine ROM.

FIG. 2 shows an example state machine that can be implemented by the ROM of FIG. 1.

FIG. 3 shows address and data values stored in the RAM of FIG. 1 to implement the state machine of FIG. 2.

FIG. 4 shows a RAM with reset according to the present invention being used as a state machine ROM.

FIG. 5 shows address and data values stored in the RAM with reset of FIG. 4 to implement the state machine of FIG. 2.

FIG. 6 shows one implementation of the reset circuit 401 of FIG. 4.

DETAILED DESCRIPTION OF THE DRAWINGS

Figure 7:
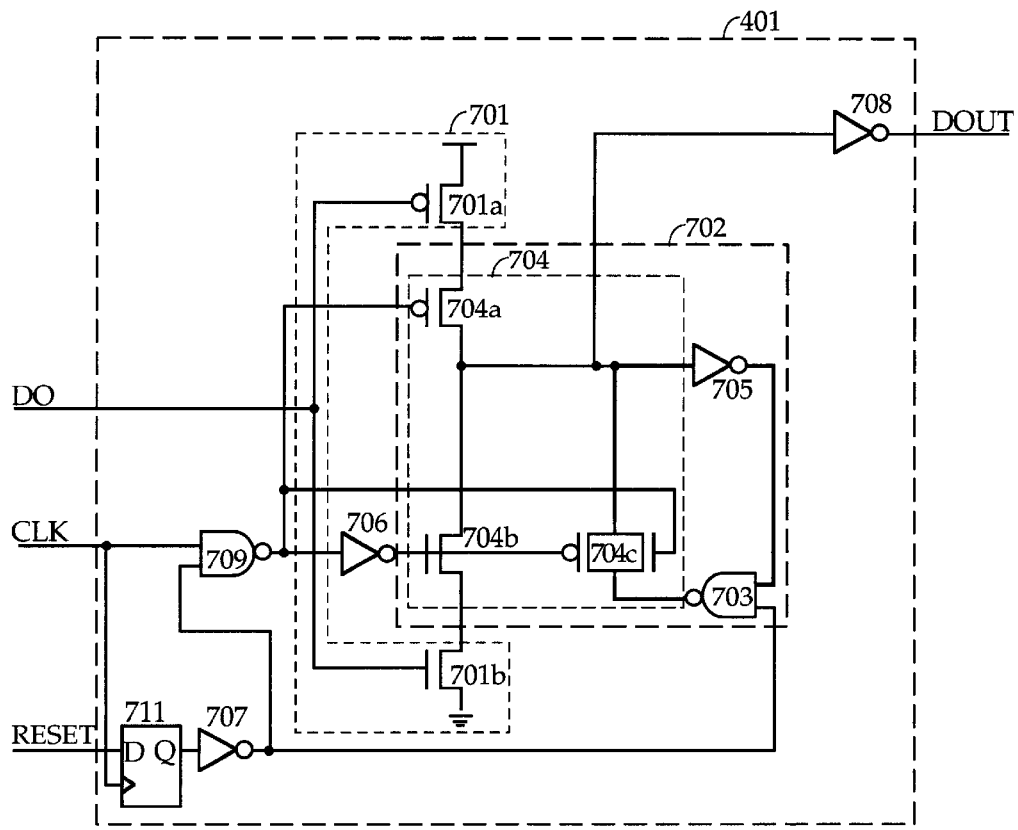
FIG. 7 shows another implementation of the reset circuit 401 of FIG. 4.

FIG. 4 shows a RAM with reset according to the present invention. The data output values DO from RAM 101 are provided as input signals to a reset circuit 401. When RESET is high, a rising edge on CLK causes all DOUT values to be 0 regardless of the values DO.

FIG. 5 shows the truth table that can be stored in RAM 101 in the presence of reset logic 401 to implement the state machine of FIG. 2. One of the DIN bits of FIG. 3 is replaced by the RESET signal of FIG. 4. Note that this simple state machine now requires only 8 memory words rather than the 16 of FIG. 3.

FIG. 6 shows one implementation of the reset circuit 401 of FIG. 4. Of course in a RAM having eight data bits, eight circuits such as shown in FIG. 6 are provided. In FIG. 6, if RESET is low, NAND gate 609 responds to CLK. In response to a rising edge of CLK, transistor 601 turns on, and transistor 604 turns off, which passes the previous value DO through inverters 600 and 608 to DOUT. But if RESET is high, NAND gate 609 provides a constant high output signal, transistor 601 turns OFF, and the value on DOUT is logic 0, not the value DO. Note that in FIG. 6 the reset action is asynchronous since the reset signal overrides the clock signal.

FIG. 7 shows another embodiment of the circuit 401 of FIG. 4. In FIG. 7, asynchronous signal RESET is stored by flip flop 711, and synchronously provided through inverter 707 to NAND gate 709 as well as to NAND gate 703 in latch 702. When RESET is low, a rising edge of CLK causes flip flop 711 and inverter 707 to place a high signal on the input of NAND gate 709, so that after a brief delay NAND gate 709 provides a low output signal, turning off transmission gate 704c and turning on transistors 704a and 704b so that the inverse of DO is provided by one of transistors 701a and 701b to latch 702 comprising inverter 705 and NAND gate 703. A falling edge of CLK turns on transmission gate 704c and turns off transistors 704a and 704b, thus storing the inverse of DO on latch 702. Thus the value DO present at the last high value of CLK is provided by inverter 708 at DOUT.

Figure 8A:
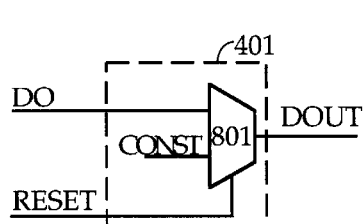
FIGS. 8a, 8b, and 8c show asynchronous implementations of the reset circuit 401 of FIG. 4.
Figure 8B:
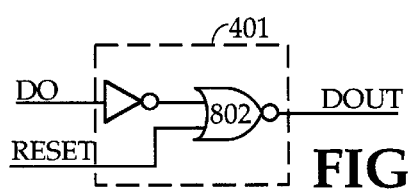
Figure 8C:
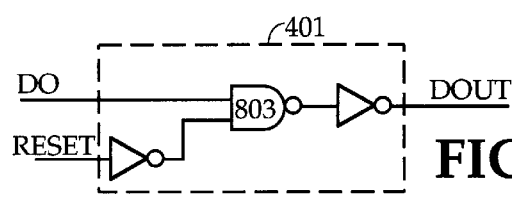

FIGS. 8a–8c show three asynchronous circuits that can be used for reset circuit 401 of FIG. 4.

FIG. 8a shows a multiplexer implementation in which the reset signal RESET is applied to the control terminal of multiplexer 801. The data input value DO is applied to one input terminal of multiplexer 801 and a reset value CONST is applied to the other input terminal. When RESET is low, the DO input value is applied to DOUT. When RESET is high, the reset value CONST, which may be 0 or 1 depending on the desired polarity of the reset signal, is applied to DOUT. There is no clock signal, and the reset operation is asynchronous.

FIG. 8b shows a NOR gate implementation in which input signal DO is inverted and applied to NOR gate 802. RESET is also applied to NOR gate 802. Thus when RESET is low, DO is inverted twice to form the DOUT signal. When RESET is high, DOUT is low regardless of DO.

Similarly, FIG. 8c shows a NAND gate implementation. When RESET is low, NAND gate 803 inverts input signal DO, and the output signal of NAND gate 803 is inverted again to form DOUT. When RESET is high, NAND gate 803 outputs a high signal regardless of DO, and this high signal is again inverted to give a low DOUT signal.

Figure 9:
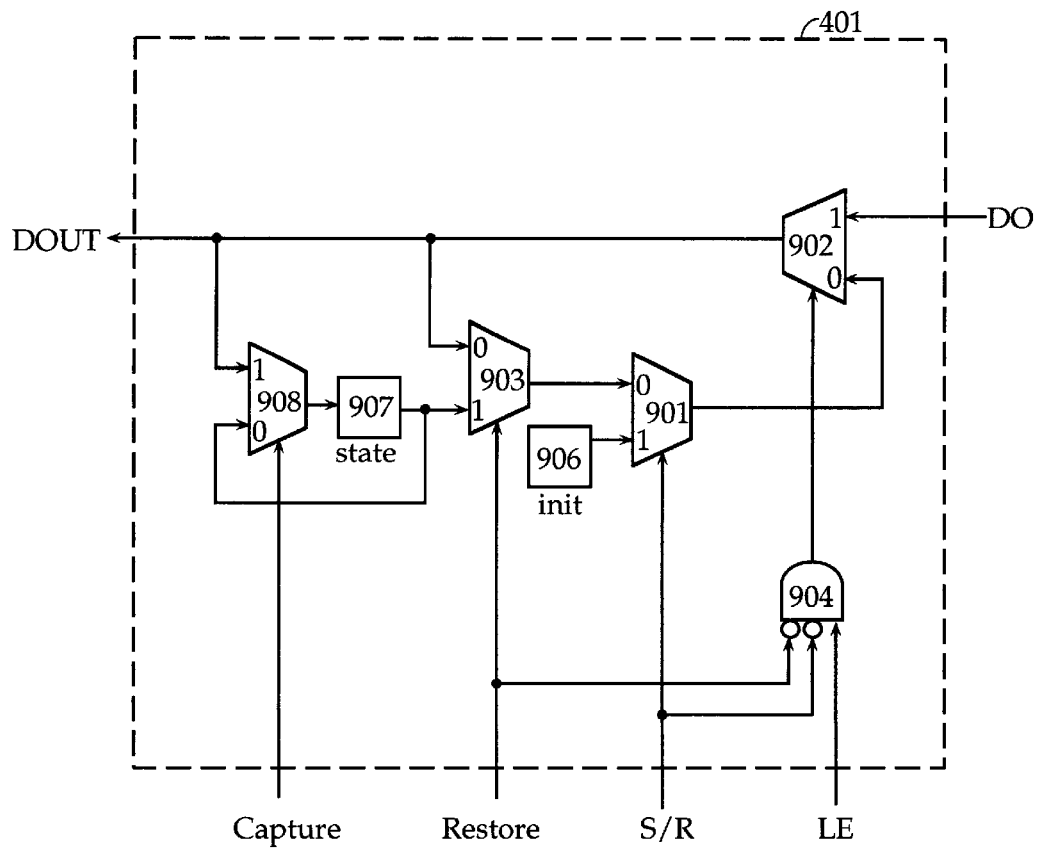
FIG. 9 shows one implementation of the reset circuit 401 of FIG. 4 with the user settable set/reset function and the capture and restore capability.

FIG. 9 shows a multiplexer based implementation of reset circuit 401 having a resetable latch with circuitry capable of capturing the value stored in the latch and restoring that value when desired. The latch is made up of MUX 901, MUX 902, and MUX 903 with outputs of MUX 901 and MUX 902 being actively driven. The latch can receive its input from either DO, the state input of MUX 903, or the unit input 906 of MUX 901. Control logic consisting of AND gate 904 and MUX 908 in combination with control signals LE, S/R, Restore, and Capture determine the operation of this resetable latch circuit. During normal operation, Capture, Restore, and S/R all equal 0. In this state, MUX 901 will output the value of DOUT and since LE is logic 0, MUX 902 will hold DOUT at a constant value. AND gate 904 will output a 1 only if LE equals 1. When LE is pulsed high, AND gate 904 will output a 1 and the value on signal DO will be input through MUX 902 into the latch. When LE returns to 0, the latch will hold the value of DO on DOUT. Thus, during normal operation, LE equal to 1 loads new data and LE equal to 0 holds the data in the latch.

During a set-reset operation, Capture, Restore, and LE are all equal 0. If a set or reset operation is desired, SR will be pulsed high. When S/R is pulsed high, the logic value stored in initialization storage cell 906 will be passed into the latch through MUX 901 and AND gate 904 will cause MUX 902 to output this value. The value stored in initialization cell 906 is programmably settable by the user. Cell 906 is typically constructed of cross-coupled inverters, but any suitable reprogrammable memory cell, such as an EEPROM may be used.

At any time, a Capture operation can be used to capture the value stored in the latch. When Capture is pulsed high, the value of DOUT will be passed through MUX 908 and written into state cell 907. State cell 907 typically has the same construction as initialization cell 906. If the value captured in the state bit 907 is required to be restored to the latch, than Restore will be pulsed high and SR must be low. While Restore is high, MUX 903 will pass the value captured in the state bit 907 to the input of MUX 901. S/R equal to 0 will cause MUX 901 to pass the state bit value into the latch. The high Restore value also causes AND gate 904 to output a 0 ensuring that MUX 902 is passing the value in the latch to its output.

The embodiments described above are illustrative only and not limiting. Other embodiments within the scope of the present invention will be apparent to those skilled in the art. The present invention is set forth in the appended claims.

What is claimed is:

1. A RAM with reset to a user selected value comprising:

a block of memory cells having:
   a plurality of address lines for addressing one word of the memory cells, and
   a plurality of data out lines; and a reset circuit receiving signals on each of said data out lines, said reset circuit including structure for providing output signals equal to the signals on said data out lines.

2. A RAM with reset as in claim 1 where said reset circuit comprises at least one memory cell for capturing the value of at least one of said data out lines.

3. A RAM with reset as in claim 2 wherein said reset circuit further includes structure for providing output signals equal to said capture value.

4. A RAM with reset as in claim 3 where said reset circuit comprises control logic circuitry for selecting between outputting the value of said data out lines, the value of a reset constant, or said capture value.

5. A RAM with reset as in claim 1 where said RAM with reset is implemented as an element within a field programmable gate array.

6. A RAM with reset as in claim 1 where said reset circuit further includes structure for providing output signals on said data out lines equal to a reset value.

* * * * *